United States Patent [19]

Ahmed

[11] 3,876,955

[45] Apr. 8, 1975

[54] BIASING CIRCUIT FOR DIFFERENTIAL AMPLIFIER

[75] Inventor: Adel Abdel Aziz Ahmed, Annandale, N.J.

[73] Assignee: RCA Corporation, New York, N.Y.

[22] Filed: July 16, 1973

[21] Appl. No.: 379,473

[52] U.S. Cl. .................. 330/30 D; 330/19; 330/22; 330/69

[51] Int. Cl. .............................................. H03f 3/68

[58] Field of Search .......... 330/19, 22, 30 D, 38 M, 330/40, 69

[56] References Cited

UNITED STATES PATENTS 3,719,833 3/1973 Free .............................. 330/30 D X 3,760,288 9/1973 Leonard ........................... 330/30 D

*Primary Examiner*—R. V. Rolinec

*Assistant Examiner*—Lawrence J. Dahl

*Attorney, Agent, or Firm*—H. Christoffersen; S. Cohen; A. L. Limberg

[57] ABSTRACT

A circuit for establishing the quiescent bias current of a differential amplifier with active collector loads (transistor loads). The collector current of an auxiliary transistor, held at the same base-emitter potential as the active loads, is applied to the input circuit of a current amplifier which supplies from its output circuit the combined emitter currents of the differential amplifier transistors. The base currents of the auxiliary transistor and of the active load transistors are decoupled from the input circuit of the current amplifier so that variations in such currents do not affect the quiescent biasing of the differential amplifier.

6 Claims, 3 Drawing Figures

BIASING CIRCUIT FOR DIFFERENTIAL AMPLIFIER

The present invention relates to the biasing of emitter-coupled transistor differential amplifiers having active collector loads.

Figure 1:
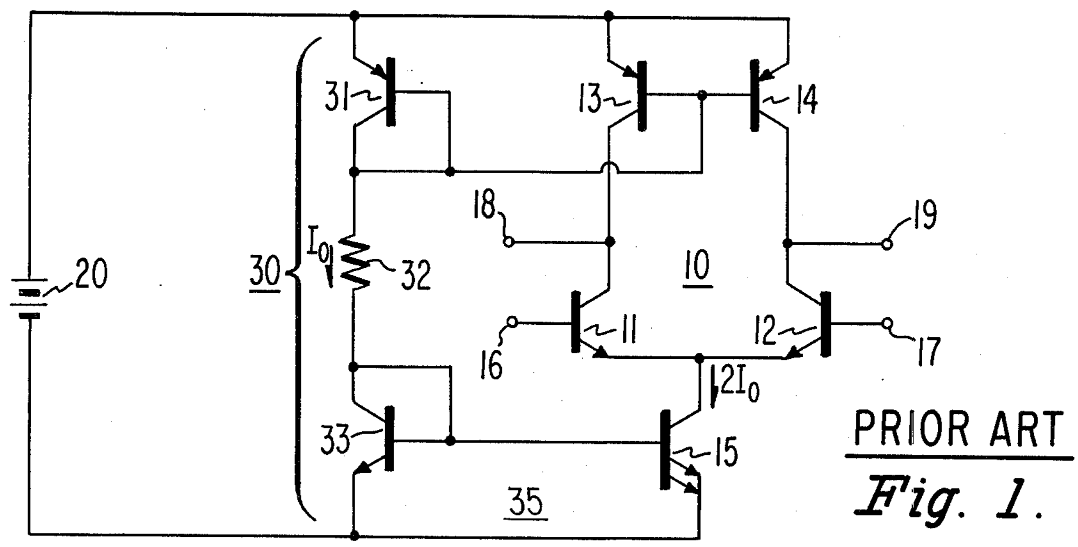
PRIOR ART Fig. 1.

A prior art circuit, as shown in FIG. 1 of the drawing employes a differential amplifier 10 having emitter-coupled transistors 11 and 12. The quiescent collector loads of transistors 11 and 12 are provided by the collector circuits of transistors 13 and 14, respectively. Transistors 13 and 14 are of a conductivity type (shown as being PNP) which is complementary to that of transistors 11 and 12 (shown as being NPN transistors). The joined emitter electrodes of transistors 11 and 12 are connected to the collector of a transistor 15, which is biased for constant collector flow in a manner to be described.

A potential source 20 supplies a reference potential to the emitter electrode of transistor 15 and an operating potential to the joined emitter electrodes of transistors 13 and 14. Input signals at potentials intermediate between the operating and reference potentials are applied to the differential amplifier 10 via terminals 16 and 17 connected to the base electrodes of transistors 11 and 12, respectively. Output signals responsive to the input signals are provided at the terminals 18 and 19 connected to the collector electrodes of transistors 11 and 12, respectively.

A bias network 30 comprises the series combination of a diode-connected transistor 31, a resistor 32 and another diode-connected transistor 33. The diode connection of each of the transistors 31 and 33 is accomplished by direct connection of its base electrode to its collector electrode. This connection causes the base-emitter potential of the transistor to be of a value characteristic of the current flow flowing through it and resistor 32 of the network 30. These base-emitter potentials change only a few millivolts over a wide range of currents and typically are about 0.7 volts for silicon transistors. The current $I_0$ equals the potential provided by the source 20 minus the sum of the base-emitter potentials of transistors 31 and 33, all divided by the resistance of resistor 32, in accordance with Ohm's Law.

The base-emitter offset potential of transistor 33 applied to the base-emitter junction of transistor 15 causes a collector current in transistor 15 twice as large as $I_0$. This current is twice as large as $I_0$ because of the base-emitter junction of transistor 15 having an effective area twice that of transistor 33, which fact is suggested in the FIG. 1 schematic by transistors 33 and 15 being respectively shown as single-emitter and double-emitter devices. (In fact, transistor 15 may alternatively comprise two parallelled transistors, each identical to transistor 33.)

The base-emitter offset potential of transistor 31 which is applied to the base-emitter junctions of similar transistors 13 and 14 causes collector currents which ideally are equal to $I_0$ in each of the transistors 13 and 14. (This ideal circumstance will be departed from if, rather than being insignificant, the base current of transistor 31 is a substantial component of the current $I_0$—that is, if $I_0$ differs significantly from the collector current of transistor 31.) Quiescently, the collector currents of transistors 13 and 14 flow as collector currents in transistors 11 and 12. The collector currents of transistors 11 and 12 are, except for their base currents, which usually may be neglected because they are relatively small, equal to their respective emitter currents. The combined emitter currents of transistors 11 and 12 are approximately equal to twice the current flow in the biasing network 30 and provide the collector current demanded by the transistor 15.

Ideally, then, the transconductance of transistor 31 times the gain of the current amplifier formed by transistors 33 and 15 times one-half will equal the transconductance of transistors 13 and 14. Ideally, the common-base amplifier current gain of transistors 11 and 12 will be unity— a condition usually closely approximated in actuality. Under these ideal conditions, there is no quiescent current flow through the two terminals 18 and 19 to subsequent circuits direct coupled thereto. The collector current supplied by the transistors 13 and 14 is substantially equal to the collector currents withdrawn by the transistors 11 and 12 to supply the collector current demanded of the transistor 15 from their emitter electrodes.

If all the transistor devices have high commonemitter forward current gains ($h_{fe}$'s), this ideal condition substantially obtains. However, in monolithic integrated circuitry, the PNP transistors 31, 13 and 14 are usually realized with a lateral structure. A lateral structure PNP usually has a low $h_{fe}$ in the order of 5 or 10, for currents less than a milliampere or two, and for higher currents its $h_{fe}$ may only be in the order of 1 or 2. The NPN transistors are formed in a vertical structure and have $h_{fe}$'s normally in excess or 40 or 50. In such circuitry, a substantial portion of the current $I_0$ flowing in resistor 32 of the biasing network 30 flows, not as the collector current of transistor 31, but as base current from transistors 31, 13 and 14. This reduces the collector currents of transistors 31, 13 and 14 with respect to the collector currents of transistors 11 and 12 as determined by the collector currents of transistors 33 and 15. Consequently, a portion of the quiescent collector currents demanded by transistors 11 and 12 cannot by supplied by the collector currents of transistors 11 and 12.

Therefore, these excess portions of the quiescent collector currents of transistors 11 and 12 must be supplied via output terminals 18 and 19, respectively, from subsequent circuitry direct coupled thereto. This demand for quiescent current from the subsequent circuitry is undesirable since it introduces a likelihood for error in the quiescent biasing of the subsequent circuitry.

The present invention is directed to solving this shortcoming. This is done by taking the actual collector current of an auxiliary transistor having the same base-emitter offset potential as the transistors providing the active collector loads for the differential amplifier and then using the collector current of this auxiliary transistor, but not its base current, to establish at a desired level the collector currents of the emitter-coupled differential amplifier transistor.

In the drawing:

FIG. 1 is a schematic diagram of a prior art emitter-coupled transistor differential amplifier using active collector loads, as described above, and FIGS. 2 and 3 are schematic diagrams of alternative embodiments of emitter-coupled transistor amplifiers, each embodying the present invention.

Figure 2:
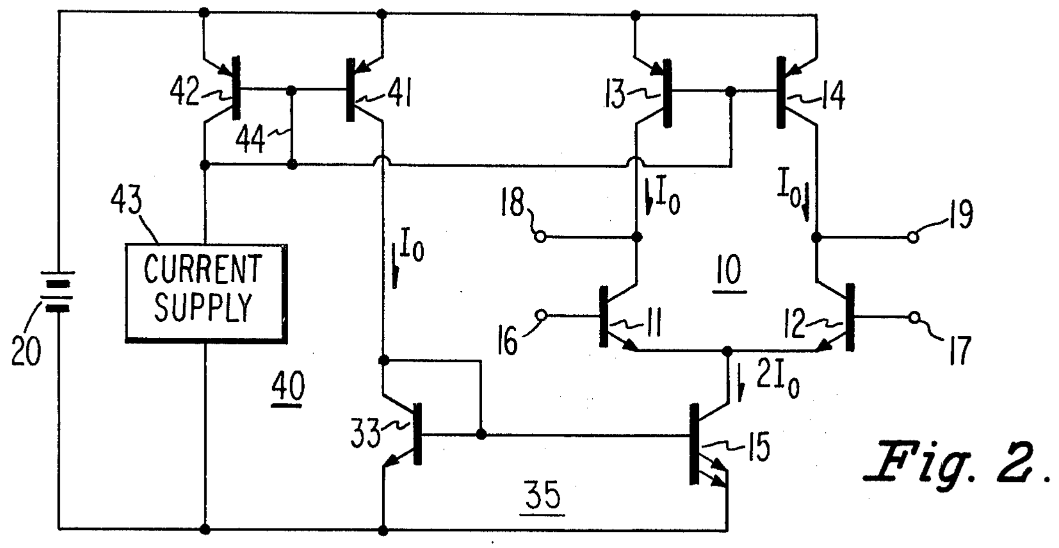

FIG. 2 shows a circuit which includes elements 10, 11, 12, 13, 14, 15, 16, 17, 18, 19, 20, and 33 each corresponding substantially in structure and function with a like-numbered element of the FIG. 1 prior art circuit. A biasing network 40 applies the same emitter-base potential to each of transistors 13 and 14 and also to transistor 41. Transistors 13, 14 and 41 are all PNP transistors of substantially identical construction, so their transconductances are substantially equal. That is, they have equal collector currents in response to the same emitter-base potential being applied to them. The value of any one of these collector currents is $I_0$.

The base current of transistor 41 forms no part of the current $I_0$. Only the collector current of transistor 41 flows as $I_0$. Consequently, the base current of transistor 41 does not derogate from the equality of (1) $I_0$ supplied as its collector current and (2) $I_0$ supplied as the collector current of either transistor 11 or 12. This contrasts with the prior art circuit of FIG. 1, in which $I_0$ is determined not solely by the collector current of transistor 31, which matches the collector currents of transistors 11 and 12, but also has the base current of transistor 31 as a component. In the FIG. 2 circuit, the current supplied to transistor 33 is the collector current alone of a transistor (41) which collector current matches that of transistors 11 and 12. There is no base current component to adversely affect this current matching. The base-emitter potential of transistor 41 is applied independent of feedback from its collector circuit, so its collector current is responsive to its base-emitter potential, rather than vice versa.

In the FIG. 2 circuit, as in the FIG. 1 circuit, transistors 33 and 15 together form a current amplifier 35 with a current gain which, because of the high $h_{fe}$3 s of these NPN transistors, is equal to minus two within a percent or two. The collector current of transistor 15 closely approximates $2I_0$ and causes quiescent collector currents in differential amplifier transistors 11 and 12, each of which is substantially equal to $I_0$.

In the FIG. 2 circuit, there is no base current component in the $I_0$ current supplied to the input circuit of current amplifier 35 any more than there is in the $I_0$ currents supplied from the collectors of transistors 13 and 14 —a condition contrasting to that found in the FIG. 1 circuit. Consequently, the quiescent collector currents of transistors 11 and 12 are better matched to the quiescent collector currents supplied from the collector electrodes of transistors 13 and 14, respectively, than is the case with the FIG. 1 prior art circuit. This substantially reduces the quiescent current flow through terminals 18 and 19 from subsequent circuitry when the $h_{fe}$'s of the PNP transistors are low in the sense previously defined.

The potential applied to the base-emitter junctions of transistors 13, 14 and 41 is determined by the base-emitter offset potential developed by a diode-connected transistor 42 biased into forward conduction by a current supply 43. The collector-to-base negative feedback connection 44 of the transistor 42 adjusts this potential (its base-emitter offset potential) to a value such that its collector and base currents together with the base currents of transistors 13 and 14 equals the current demand of current supply 43. The collector currents of transistors 41 and 42 will be related in proportion to their relative transconductances. Assuming their transconductances to be equal to each other and assuming the combined base currents of transistors 41, 13 and 14 to be less than the collector current of transistor 41, $I_0$ will be approximately equal to the current demand of current supply 43.

Current supply 43 may comprise a resistor having the current flow therethrough determined by the potential provided by source 20 minus the base-emitter potential of transistor 41, all divided by the resistance of the resistor. Alternatively, the current supply may be provided from the collector-to-emitter circuit of a transistor having constant current bias. Another alternative is to use a self-biased field-effect transistor as a current supply.

To improve the matching of their collector currents transistors 13, 14, 41 and 42 may be provided with equal-resistance emitter degeneration resistors (not shown). To make the current gain of the current mirror amplifier comprising transistors 33 and 15 more exactly and reliably equal to minus two, transistors 15 and 33 may be provided with emitter degeneration resistors (not shown) having resistances in 1:2 ratio. The current mirror amplifier formed by transistors 15 and 33 may be replaced with other known types of current mirror amplifier. Furthermore, the transistor 42 forms a current mirror amplifier with each of transistors 13, 14 and 41. This compound current mirror amplifier may be replaced with a compound mirror amplifier based on other known types of current mirror amplifiers without departing from the present invention.

Figure 3:
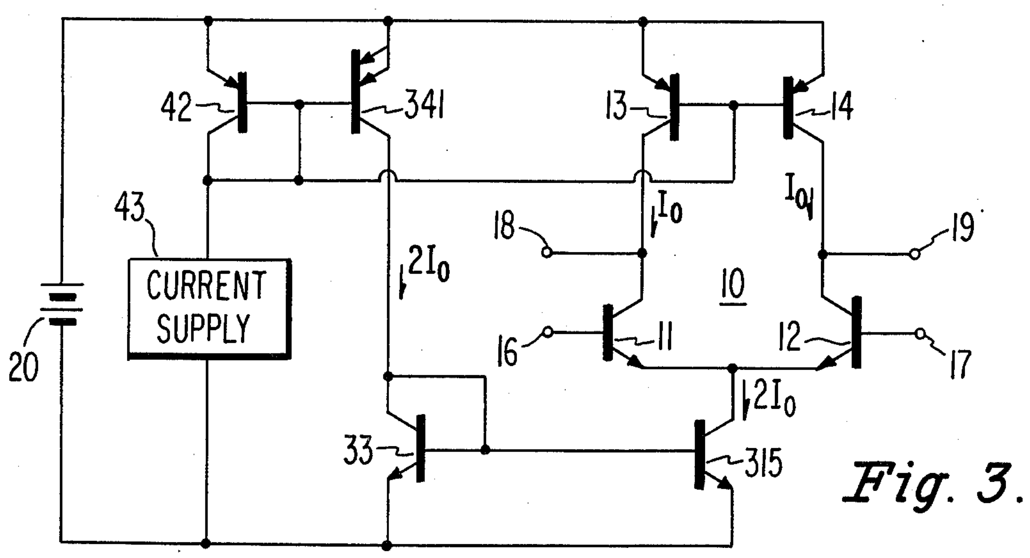

FIG. 3 shows an alternative embodiment of the present invention. Transistor 341 is made to have twice the effective base-emitter junction area as either transistor 13 or transistor 14 has, so the transconductance of transistor 341 is substantially twice as large as that of transistor 13 or 14. Consequently, since the base-emitter potentials of transistors 341, 13 and 14 are identical, the collector current of transistor 341 will be $2I_0$—i.e., twice the $I_0$ collector currents of transistors 13 and 14. The current gain of the current mirror amplifier comprising transistors 33 and 315 is made to equal minus unity, by making them have equal effective base-emitter junction areas. Transistors 33 and 315 may be afforded emitter degeneration resistors (not shown) having resistances equal to each other. Transistors 42, 341, 13 and 14 may be provided with emitter degeneration resistors (not shown) having resistances in 2:1:2:2 ratio.

In either of the configurations of FIGS. 2 and 3, transistors 11 and 12 may each be a compound transistor (e.g., a Darlington pair). Transistors 11 and 12 may be emitter-coupled via a resistor center-tapped for connection to the constant current transistor 15 or 315. Transistors 11 and 12 may be emitter-coupled via a resistor and have constant current withdrawn from their emitters by the collector circuits of parallelled constant current transistors, each providing half the current alternatively provided by transistor 15 or 315.

In either of the configurations of FIGS. 2 and 3, transistor 11 can have its collector electrode directly connected to the potential source 20 if signals are not to be supplied from its collector electrode, but are only to be supplied from the collector electrode of transistor 12.

Other embodiments of the present invention in which the gain of the current amplifier 35 differs from that in the embodiments shown in FIGS. 2 and 3 are possible. As in the FIGS. 2 and 3 configurations, the product of the effective transconductance of the transistor supplying collector current to the input of current amplifier 35 times the current gain of current amplifier 35 times one-half should substantially equal the effective transconductance of transistors 13 and 14.

The present invention may be used to bias differential amplifiers using three-terminal amplifier devices other than bipolar transistor. Such devices will have an input electrode corresponding to a base electrode, a common electrode corresponding to an emitter electrode, and an output electrode corresponding to a collector electrode.

What is claimed is:

1. In a differential amplifier including means for supplying an operating potential between its first and second terminals; first and second amplifier devices of a first conductivity type, each of said amplifier devices having an input electrode and a common electrode and an output electrode, said common electrodes being coupled to a common node; and a first transistor of a second conductivity type complementary to said first conductivity type, said first transistor having a collector electrode connected to the output electrode of said first amplifier device so quiescent current can flow between them, said first transistor having an emitter electrode connected to the first terminal of said means for supplying an operating potential, said first transistor having a base electrode and a base-emitter junction between its base and emitter electrodes, a biasing circuit comprising:

a second transistor being of said second conductivity type, having a collector electrode, having an emitter electrode connected to the first terminal of said means for supplying an operating potential, having a base electrode, and having a base-emitter junction between its base and emitter electrodes, proportioned to the base-emitter junction of said first transistor so that the transconductance of said second transistor is substantially twice that of said first transistor;

a current amplifier having an input circuit connected between said second transistor collector electrode and the second terminal of said means for supplying an operating potential and for receiving solely the collector current of said second transistor, an output circuit connected between said common node and the second terminal of said means for supplying an operating potential and for determining the total level of current flow through said common node, and a current gain of substantially unity amplitude; and means for supplying between its first and second terminals a bias potential derived independently of the aforesaid connections, the first terminal of said means for supplying a bias potential being connected to the first terminal of said means for supplying an operating potential, the second terminal of said means for supplying a bias potential having the base electrodes of said first and said second transistors connected thereto, the poling of the biasing potential being such as to forward-bias the base-emitter junctions of said first and said second transistors.

2. A biasing circuit as claimed in claim 1 wherein said means for supplying a bias potential comprises:

a third transistor having a base electrode coupled to said second terminal of said means for supplying a bias potential, having an emitter electrode coupled to said first terminal of said means for supplying a bias potential, and having a collector electrode;

a direct current feedback connection from the collector electrode to base electrode of said third transistor; and a current supply coupled between the emitter and collector electrodes of said third transistor.

3. A biasing circuit for an amplifier configuration including first and second transistors of a first conductivity type and a third transistor of a second conductivity type complementary to the first conductivity type, each said transistor having a base and an emitter and a collector electrode, said first and said second transistors being connected as an emitter-coupled differential amplifier, the collector electrodes of said first and said third transistors being connected so quiescent collector current is supplied by one of them to the other; said biasing circuit comprising:

a fourth transistor of the same conductivity type as said third transistor, having a base electrode and an emitter electrode and a collector electrode;

a current amplifier having an input circuit, which input circuit is direct current conductively connected to the collector electrode of said fourth transistor for receiving solely the collector current of said fourth transistor, and having an output circuit direct current conductively coupled to the emitter electrodes of said first and said second transistors, and having a current gain of substantially unity amplitude;

means for deriving a bias potential independently of the aforesaid elements and for applying said bias potential between first and second points; and means including connections of the base electrodes of said third and said fourth transistors to said first point and connections of the emitter electrodes of said third and said fourth transistors to said second point for conditioning said third and said fourth transistors to respond to said bias potential with respective collector currents in 1:2 ratio.

4. A biasing circuit as claimed in claim 3 wherein said means for deriving and for applying a bias potential comprises:

a current supply;

a fifth transistor of the same conductivity type as said third and said fourth transistors, said fifth transistor having a base electrode and an emitter electrode respectively connected to said first and said second points and having a collector electrode coupled to said current supply; and means for applying direct coupled collector-to-base feedback to said fifth transistor.

5. A biasing circuit as claimed in claim 3 wherein said current amplifier comprises:

fifth and sixth transistors of said first conductivity type having collector electrodes direct current conductively coupled respectively to said fourth transistor collector electrode and to the emitter electrodes of said first and said second transistors, having base electrodes direct coupled from said fifth transistor collector electrode, and having emitter electrodes connected to a reference potential.

6. A bias circuit as set forth in claim 3 wherein said means for deriving and for applying a bias potential and applying the same between said first and said second points comprises:

semiconductor diode means connected between said first and said second points; and means applying forward bias current to said semiconductor junction, to develop said bias potential across said semiconductor diode means.

* * * * *